Oct. 1, 1968 D. P. BURKS ET AL 3,404,215
HERMETICALLY SEALED ELECTRONIC MODULE
Filed April 14, 1966
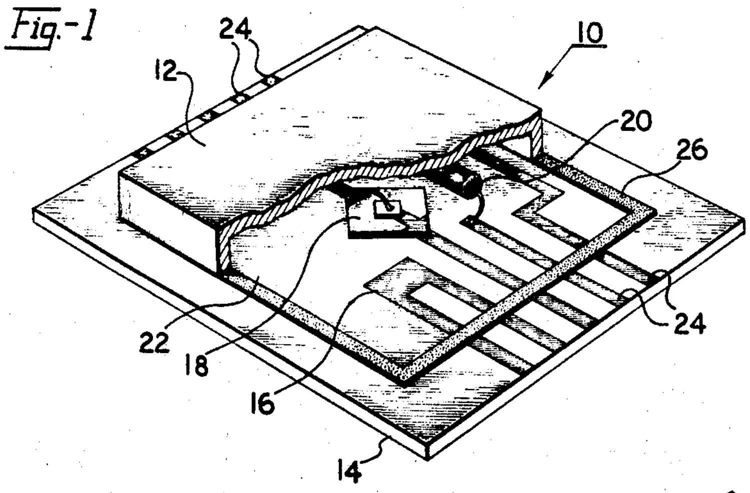
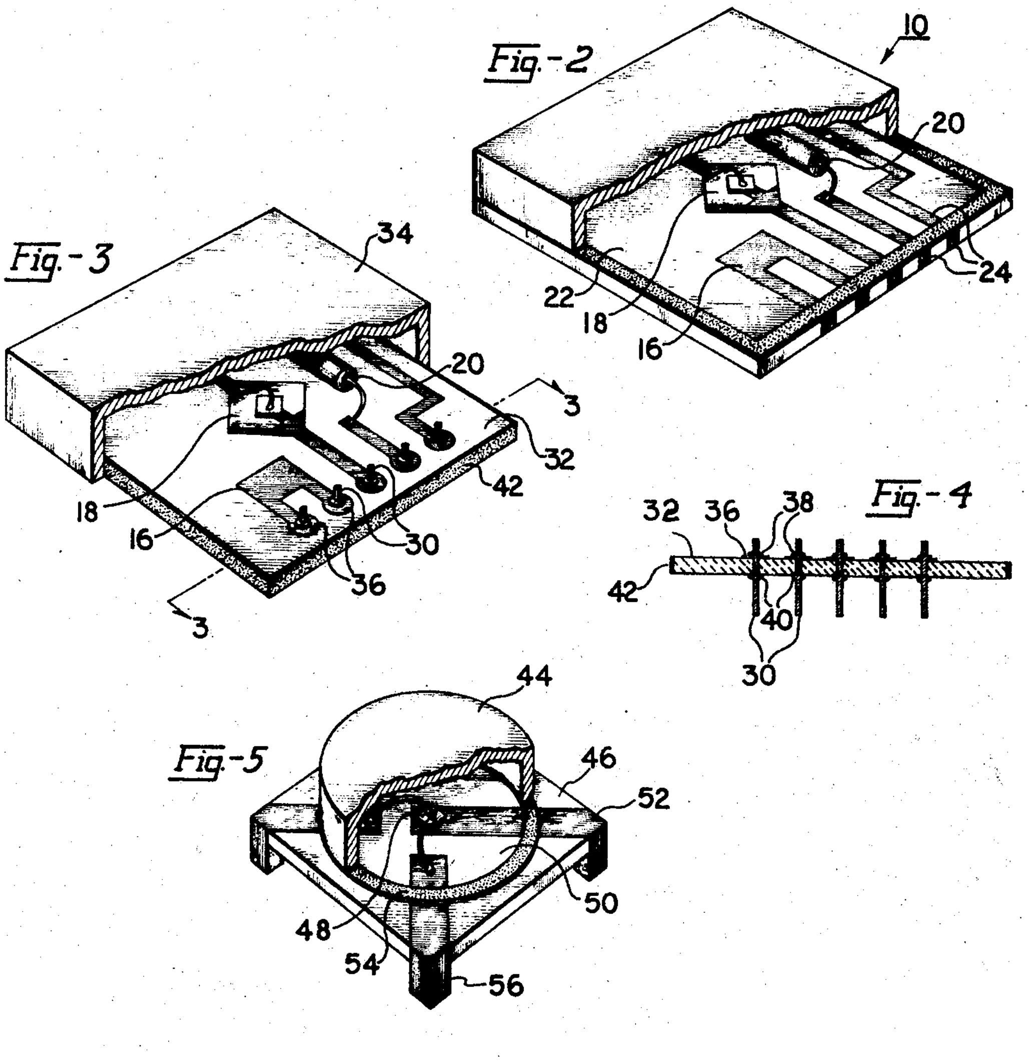
Fig.-2 Fig.-3 Fig.-4 Fig.-5

United States Patent Office
3,404,215
Patented Oct. 1, 1968

3,404,215

HERMETICALLY SEALED ELECTRONIC MODULE

Darnall P. Burks and Jacob H. Martin, Williamstown, Mass., assignors to Sprague Electric Company, North Adams, Mass., a corporation of Massachusetts Filed Apr. 14, 1966, Ser. No. 542,609
1 Claim. (Cl. 174—52)

ABSTRACT OF THE DISCLOSURE

A nonconducting substrate having conductive terminals affixed thereto is provided with a ring of insulating material which surrounds an area of the substrate and overlies the terminals extending from that area. At least one component is located within the surrounded area and electrically connected to one of the terminals within the area. A shell encloses the surrounded area and is sealed to the substrate by metallic means in association with the insulating ring.

This invention relates generally to electronic modules and more particularly to a combination of electronic elements hermetically enclosed on a nonconducting substrate having extended terminals.

In the present state of the microcircuit art, the production of hermetically sealed modules by sealing a circuit bearing substrate within an outer enclosure generally results in units having increased volume and weight as well as poor thermal dissiption capability. A further disadvantage of the prior art is that these structures generally employ a recessed body having leads extended through the walls, and require the connection of circuits and components within the confining walls.

It is an object of this invention to provide a hermetically sealed module in which the circuit substrate is an integral portion of the sealed enclosure.

It is a further object of this invention to provide a hermetically sealed module of low volume and weight and high thermal dissipation in which components and terminals are assembled on a circuit substrate and then enclosed by a cover or shell which is bonded to it.

It is a further object of this invention to provide a hermetically sealed module having extended terminals which lie on or pass through the circuit substrate and do not engage the enclosing shell.

These and other objects of this invention will become more apparent upon consideration of the following description taken in conjunction with the drawing in which:

FIGURE 1 is a perspective view, partially cut away, illustrating one embodiment of the invention in which the circuit substrate extends beyond the sealed area;

FIGURE 2 is a perspective view illustrating the extension of thin film terminals over the edge of the substrate;

FIGURE 3 is a perspective view of an embodiment having leads extended through the substrate;

FIGURE 4 is a sectional view taken along line 3—3 of FIGURE 3; and

FIGURE 5 is a perspective view of a further embodiment of the invention.

In accordance with the present invention, a hermetically sealed module comprises a nonconducting substrate constituting one wall of said module, and having at least one electronic element affixed to the inside surface thereof. A shell encloses the element and is hermetically sealed to the substrate by fusible material. Conductive terminals in connection with the element are hermetically sealed to the substrate and extend from the sealed enclosure without engaging the shell.

In one embodiment of the invention, electronic elements are interconnected between themselves and thin film conductive terminals on the inner major surface of a ceramic substrate with the terminals extended to the periphery of the substrate. An insulating ring of fusible material is provided over the terminals outside the element area and a shell is hermetically bonded to the substrate by the sealing ring.

A low temperature seal is provided by the addition of a layer of metalization and a brazing or soldering alloy over the insulating ring. In a further embodiment the terminals are extended through the substrate and hermetically sealed to it.

Referring now to the drawing and to FIGURE 1 in particular wherein a sealed module 10 is shown having a shell 12 partially cut away to expose an underlying nonconducting substrate 14 which constitutes one wall of the module 10. Electronic elements 16, 18 and 20 are shown grouped together on the inside surface 22 of substrate 14 in connection to thin film terminals 24, which extend along surface 22 from within the enclosing shell 12 to the perimeter of the substrate. A ring 26 of fusible insulating material passes over the terminals 24 and encompasses the grouped elements so as to seal the hollow shell 12 to surface 22 and complete the module 10.

The module 10 is constructed by first depositing metallic films on a glass or ceramic substrate 14 of aluminum oxide or the like. In this way elements 16 such as resistors or capacitors or the like are deposited along with and in connection to terminals 24, which may be silver, nickel or other suitable conductor. Similarly other deposited elements or integrated circuits may be provided on substrate 14.

Thereafter a sealing ring 26 of fusible material, such as a glass or ceramic frit, is applied to enclose a generally central area of surface 22. The ring 26, which substantially conforms to the perimeter of shell 12, passes over terminals 24 allowing them to extend out of the sealed area.

Discrete components, such as a diode 18 or a resistor 20, may then be mounted on the planar substrate 14 in connection to terminals 24 and various other components such as transistors, capacitors, inductors and transformers may be similarly incorporated in the circuit structure. Some or all of the discrete components 18, 20 could be positioned in a depression or indent (not shown) with leads extended substantially parallel to the substrate surface 22 for connection to terminals 24. Connection to the bottom of the device 18 could still be provided by extending a terminal into the depression; the component could, of course, utilize extended leads for all its elements. Thus, a single component or a plurality of components and terminals may be affixed to a planar surface, rather than within a walled-in or recessed area. This permits various mass production techniques, such as dip soldering or silk screening, or the like, to be employed.

Once the circuit is complete the shell or cap 12, which has a hollow interior, is sealed to the substrate 14. This is accomplished in this embodiment by engaging the sealing ring 26 with the edge of the shell 12 and heating the structure at elevated temperatures to soften the fusible material and hermetically bond the substrate and shell together.

A brazing or soldering alloy, such as tin, 95–5 tin-silver, tin-lead eutectic, gold-tin eutectic or the like may also be utilized for sealing the structure. In such a case, the indicated ring 26 would be retained, as an insulating coating over the terminals and an additional ring of metalizing material, such as dispersion electrodes or organometallic ceramic metalizing compositions or other metalizing required for a hermetic seal, is deposited over the ring. In addition, the mating edge of the shell would also require metalizing such as by gold plated moly-titanium or moly-manganese or gold-platinum resinates, or the like.

Seals of high reliability are provided by constructing the shell of the same material as the substrate. Thus alumina, beryllia, magnesia, sapphire, and glass are suitable for both. Of course, a shell of metal or other ceramic could be also employed, however, its thermal coefficient of expansion should substantially match that of the insulator substrate for at least a limited temperature range, such as from the minimum operating temperatures to the maximum sealing temperatures. The use of soft solder, however, will permit greater mismatch by reason of its relatively low sealing temperature and its plasticity under stress, which will relieve the differential expansion of the joined parts.

Thus, in accordance with the invention, the circuit substrate is not confined within a module, but rather is an integral part of the module, since the substrate constitutes one wall of the module. This construction provides excellent thermal dissipation capabilities by avoiding the additional thermal interfaces of the prior art, while providing hermetic sealing of the circuit elements and extended terminals for external connections.

As illustrated in FIGURE 1, the substrate may extend beyond the perimeter of the shell to support the metalized terminations, or as shown in FIGURE 2 the substrate need extend only to the perimeter, since the terminations may pass over the substrate edge and also to the bottom surface (not shown). Construction of this module is identical to that described with regard to FIGURE 1, with however, the extension of the terminals over the substrate edge.

A further extension of the terminals to the bottom or outer surface of the substrate also permits the shell to be sealed to the substrate edge. In the latter case, the substrate is fitted within the shell and carries a sealing ring along its edge, similar to that shown in FIGURE 3.

In the latter figure, a modification of the terminal arrangement is illustrated. Thus as shown in FIGURES 3 and 4 leads 30 are extended through a substrate 32 and sealed thereto. The overall construction, however, is similar to that of FIGURES 1 and 2 in that the circuit is assembled on the flat substrate 32 in connection to terminals 30, and then enclosed by a shell 34 with the substrate forming one wall of the module.

In this embodiment, a substrate 32 is first prepared with a series of apertures. Thereafter metal conductors 36 which extend into the component area are provided around each opening, and a lead having an upset 38 is positioned in the aperture and locked in electrical contact with conductor 36 by a second upset 40 at the bottom of the substrate.

Thereafter, the leads 30 may be hermetically sealed to the substrate 32 by a fusible material such as glass or ceramic frit, or a brazing or soldering alloy. In the latter case, which insures electrical contact of the terminals to conductors 36, the substrate surfaces adjacent the aperture are first metallized with gold plated molybdenum manganese or the like.

Various components, such as thin film devices 16 and discrete components 18 and 20, may then be deposited or mounted on the substrate 32 in connection to terminals 30 and the module completed by bonding a shell to the planar surface of the substrate as in FIGURE 1, or by sealing the inner edge of the shell 34 to the periphery of the substrate as illustrated in FIGURE 3.

In the latter case, a close fit of the shell to the perimeter of the substrate is provided and at least one is coated in the area of the seal with a fusible material 42 such as glass, or ceramic frit, or brazing alloy. As indicated, for brazing or soldering both the shell and substrate are first prepared with a metalizing suitable for hermetic seals. The shell is positioned with its inner edge contacting the substrate perimeter and the structure then heated to effect a hermetic seal.

Advantageously either conductive or nonconductive bonding materials may be employed with each of the described embodiments. One advantage of the use of soldering materials is that low melting materials such as tin-lead or the like may be employed, and the circuit thereby exposed to lower sealing temperatures.

Obviously the shell and substrate, although illustrated as generally rectangular, could be of various shapes. Thus, the use of a shell having a cylindrical cross section, as shown for example in FIGURE 5, would be suitable. Herein, a cylindrical shell 44 is bonded to a rectangular substrate 46 which carries a single element 48 on its inner major surface 50 in connection to terminals 52, which extend along surface 50 under a ring of fusible material 54 and over the edge of the substrate. The outer major surface of the substrate is extended at the four corners to provide legs 56.

This construction provides metallized terminals 52 extended at right angles to the substrate. The legs 56 may be passed through openings in a circuit board for connection on the other side of it or may be mounted on and connected to circuit contacts. In the latter case, the terminals 52 would generally be extended to the bottom surface (not shown) of the support legs 56.

A depression, not shown, may also be provided in the embodiment illustrated in FIGURE 5. This would, of course, require the extension of one of the terminal strips 52 to the bottom of the depression or would require that all connections to component 48 be provided by leads which are connected in turn to terminals 52 surrounding the depression.

Various modifications are possible; for example, the shell could also be constructed from more than one piece. A side wall or frame may be bonded to a cover to construct the shell which is later sealed to the completed circuit bearing substrate, or the frame and cover could be sealed together when the substrate seal is made. In the latter case the top and bottom could both be circuit carrying substrates for increased packing density. In any case, all the electronic components and their terminals would be fabricated on planar surfaces of the package.

Thus many different modifications of the invention may be possible without departing from the scope and spirit thereof, and it should be understood that the invention is not to be limited except as in the appended claim.

We claim:

1. A hermetically sealed module comprising a nonconducting substrate constituting one wall of the module, extended conductive terminals affixed to a surface of said substrate, a ring of insulating material surrounding an area on said surface of said substrate, portions of said terminals extending from within said area to outside said area by passing under said ring, at least one electronic element located within said area and electrically connected to one of said terminal portions within said area, a shell enclosing said area and sealed to said substrate with metallizing material deposited on said insulating ring, and a brazing or soldering composition deposited on said metallized material.

References Cited

UNITED STATES PATENTS

| | | | |
|---|---|---|---|
| 3,105,868 | 10/1963 | Feigin et al. | 174—68.5 |
| 3,308,525 | 3/1967 | Tsuji et al. | |
| 2,995,686 | 8/1961 | Selvin. | |
| 3,072,832 | 1/1963 | Kilby. | |
| 3,254,389 | 6/1966 | Andres et al. | 174—52 |
| 3,312,771 | 4/1967 | Hessinger et al. | 174—52 |

DARRELL L. CLAY, *Primary Examiner.*